(12) United States Patent
Ikemoto

(10) Patent No.: US 8,811,028 B2
(45) Date of Patent: Aug. 19, 2014

(54) SEMICONDUCTOR DEVICE AND CIRCUIT BOARD

(75) Inventor: Yoshihiko Ikemoto, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 350 days.

(21) Appl. No.: 12/974,107

(22) Filed: Dec. 21, 2010

(65) Prior Publication Data

US 2011/0157852 A1 Jun. 30, 2011

(30) Foreign Application Priority Data

Dec. 25, 2009 (JP) ................................. 2009-294179

(51) Int. Cl.
*H05K 7/10* (2006.01)
*H05K 7/12* (2006.01)

(52) U.S. Cl.
USPC .......................... 361/767; 361/772; 361/774

(58) Field of Classification Search
USPC ......... 361/760–764, 813, 772–774; 174/51.1, 174/520–524; 257/666–670, 720–730
See application file for complete search history.

(56) References Cited

U.S. PATENT DOCUMENTS

| 5,057,805 | A | * | 10/1991 | Kadowaki | 333/247 |
|---|---|---|---|---|---|
| 5,420,758 | A | * | 5/1995 | Liang | 361/813 |
| 5,490,041 | A | * | 2/1996 | Furukawa et al. | 361/777 |
| 5,497,030 | A | | 3/1996 | Takeuchi | |
| 5,789,280 | A | * | 8/1998 | Yokota | 438/123 |
| 5,877,548 | A | * | 3/1999 | Washida et al. | 257/690 |
| 5,917,233 | A | * | 6/1999 | Fryklund et al. | 257/666 |
| 6,313,598 | B1 | * | 11/2001 | Tamba et al. | 318/722 |
| 7,727,816 | B2 | * | 6/2010 | Do et al. | 438/123 |
| 2002/0050380 | A1 | * | 5/2002 | Tanimura et al. | 174/52.1 |
| 2002/0053729 | A1 | | 5/2002 | Takikawa et al. | |
| 2007/0003194 | A1 | | 1/2007 | Ueno et al. | |
| 2008/0013298 | A1 | * | 1/2008 | Sharma et al. | 361/813 |
| 2008/0217750 | A1 | | 9/2008 | Misumi et al. | |

FOREIGN PATENT DOCUMENTS

| JP | 02-148860 A | 6/1990 |
|---|---|---|
| JP | 03-231448 A | 10/1991 |
| JP | 4-028259 A | 1/1992 |
| JP | 05-183095 A | 7/1993 |
| JP | 5-291468 A | 11/1993 |
| JP | 07-14976 A | 1/1995 |
| JP | 7-312403 A | 11/1995 |
| JP | 2002-76235 A | 3/2002 |
| JP | 2007-013040 A | 1/2007 |
| JP | 2008-218776 A | 9/2008 |

OTHER PUBLICATIONS

Notification of Reason for Refusal dated Aug. 27, 2013, issued in corresponding Japanese Patent Application No. 2009-294179, with English translation (10 pages).

* cited by examiner

*Primary Examiner* — Tuan T Dinh
(74) *Attorney, Agent, or Firm* — Westerman, Hattori, Daniels & Adrian, LLP

(57) ABSTRACT

A semiconductor device for mounting on a wiring board includes: a container for containing a semiconductor chip; and a plurality of leads, each of the plurality of leads includes a mount connection portion at one end for the semiconductor device to be connected to the wiring board, wherein the plurality of leads includes first leads and second leads, a signal transmission rate of the first leads is higher than that of the second leads, and the mount connection portion of each of the first leads is smaller than that of each of the second leads.

13 Claims, 16 Drawing Sheets

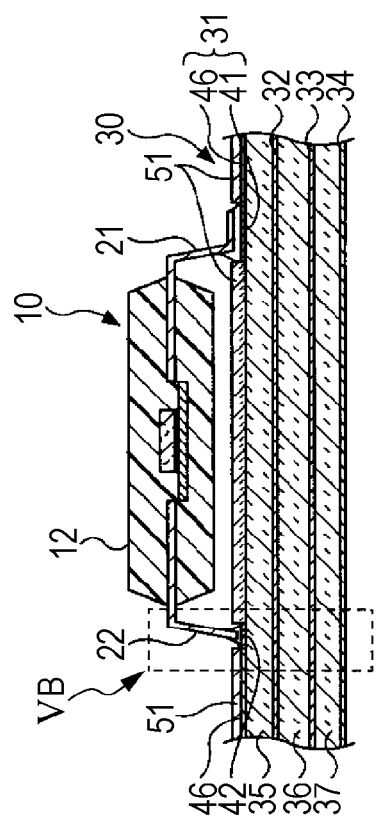
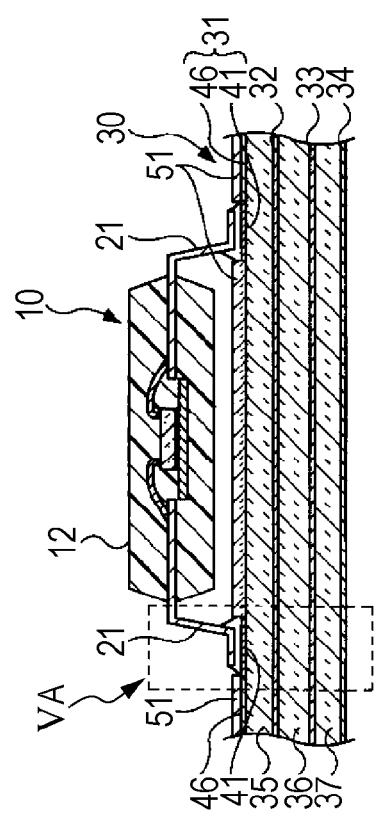

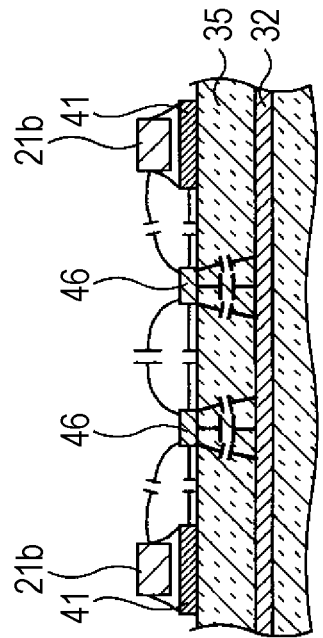
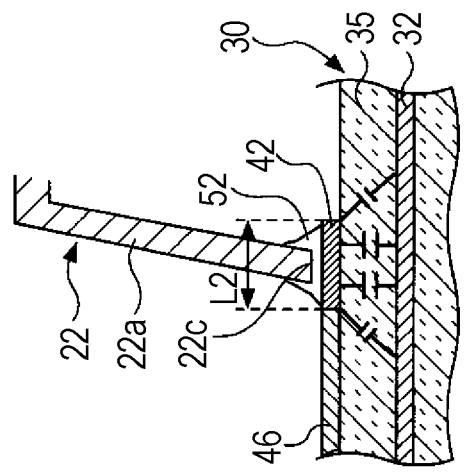

FOR PACKAGE OF PITCH
OF 0.5mm OR SHORTER w1(TYPICAL VALUE) +
0.03mm ≤ W1 ≤ P × 0.6mm

L1 ≥ l1(TYPICAL VALUE) + 0.60mm

FOR PACKAGE OF PITCH
OF 0.5mm OR SHORTER w2(TYPICAL VALUE) +
0.03mm ≤ W2 ≤ P × 0.6mm l2 ≤ L2 < l2 + 0.60mm

CLOCK DRIVER SIDE                               CLOCK RECEIVER SIDE

SEMICONDUCTOR DEVICE AND CIRCUIT BOARD

CROSS-REFERENCE TO RELATED APPLICATION

This application is based upon and claims the benefit of priority from the prior Japanese Patent Application No. 2009-294179 filed on Dec. 25, 2009, the entire contents of which are incorporated herein by reference.

FIELD

This embodiments discussed herein are related to a semiconductor device having a plurality of leads and a circuit board.

BACKGROUND

As electronic systems are provided with higher performances, more sophisticated functions and smaller sizes, semiconductor devices and wiring boards to be used for the electronic systems are required to work at higher speed or to be mounted in higher density. Thus, semiconductor devices such as a chip scale package (CSP), a multi-chip module and a system in package (SiP) have been developed.

As one of such package forms, a form having a plurality of surface mount leads such as an SOP (Small Outline Package) and a QFP (Quad Flat Package) is widely used. The leads each are of a so-called gull wing type or a J-lead type, and are connected to mount pads formed on a surface of a wiring board.

As high density mounting progresses, lots of leads and mount pads have come to be arranged at a narrow pitch down to, e.g., 0.3 mm pitch. Such narrow pitch arrangements are likely to cause a problem in that a solder bridge or something causes a short circuit between adjacent mount pads. In order to deal with such a problem, a method is proposed for making every other surface mount lead into different shapes so as to shift positions of the mount pads and to broaden separations between the adjacent mount pads. Further, a method is proposed for mixing surface mount leads and insert leads to be inserted into through holes of a wiring board.

The followings are reference documents.
[Document 1] Japanese Laid-open Patent Publication No. 04-28259.
[Document 2] Japanese Laid-open Patent Publication No. 05-291468.
[Document 3] Japanese Laid-open Patent Publication No 07-312403.
[Document 4] Japanese Laid-open Patent Publication No. 2007-13040.

SUMMARY

According to an aspect of the embodiment, a semiconductor device for mounting on a wiring board includes: a container for containing a semiconductor chip; and a plurality of leads, each of the plurality of leads includes a mount connection portion at one end for the semiconductor device to be connected to the wiring board, wherein the plurality of leads includes first leads and second leads, a signal transmission rate of the first leads is higher than that of the second leads, and the mount connection portion of each of the first leads is smaller than that of each of the second leads.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4A is a cross section for illustrating IVA-IVA section illustrated in FIG. 3;

FIG. 4B is a cross section for illustrating IVB-IVB section illustrated in FIG. 3;

FIG. 8A is a cross section for illustrating parasitic capacitance caused in connections between leads and pads;

FIG. 8B is a cross section for illustrating parasitic capacitance caused in connections between leads and pads;

DESCRIPTION OF EMBODIMENTS

Figure 1:
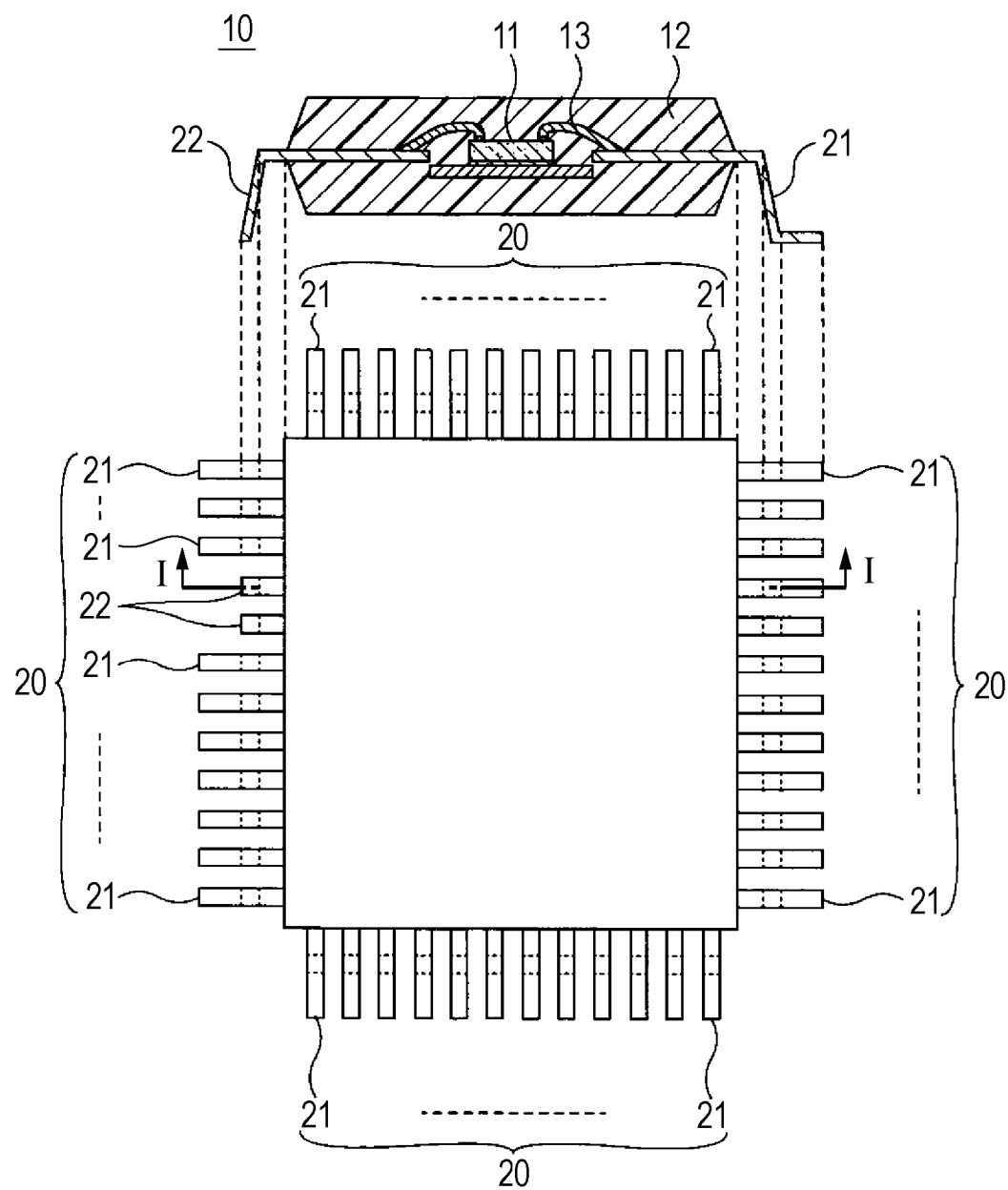
FIG. 1 illustrates a semiconductor device of a first embodiment.

Embodiments will be explained below in detail with reference to the drawings. Incidentally, in the drawings, various components are not necessarily illustrated on a same scale. Further, throughout all the drawings, same or corresponding components are given a same or similar reference numeral.

First Embodiment

To start with, a semiconductor device 10 of a first embodiment and a circuit board of it will be explained with reference to FIGS. 1-5. FIG. 1 illustrates a cross section and a top view of the semiconductor device 10.

Figure 2:
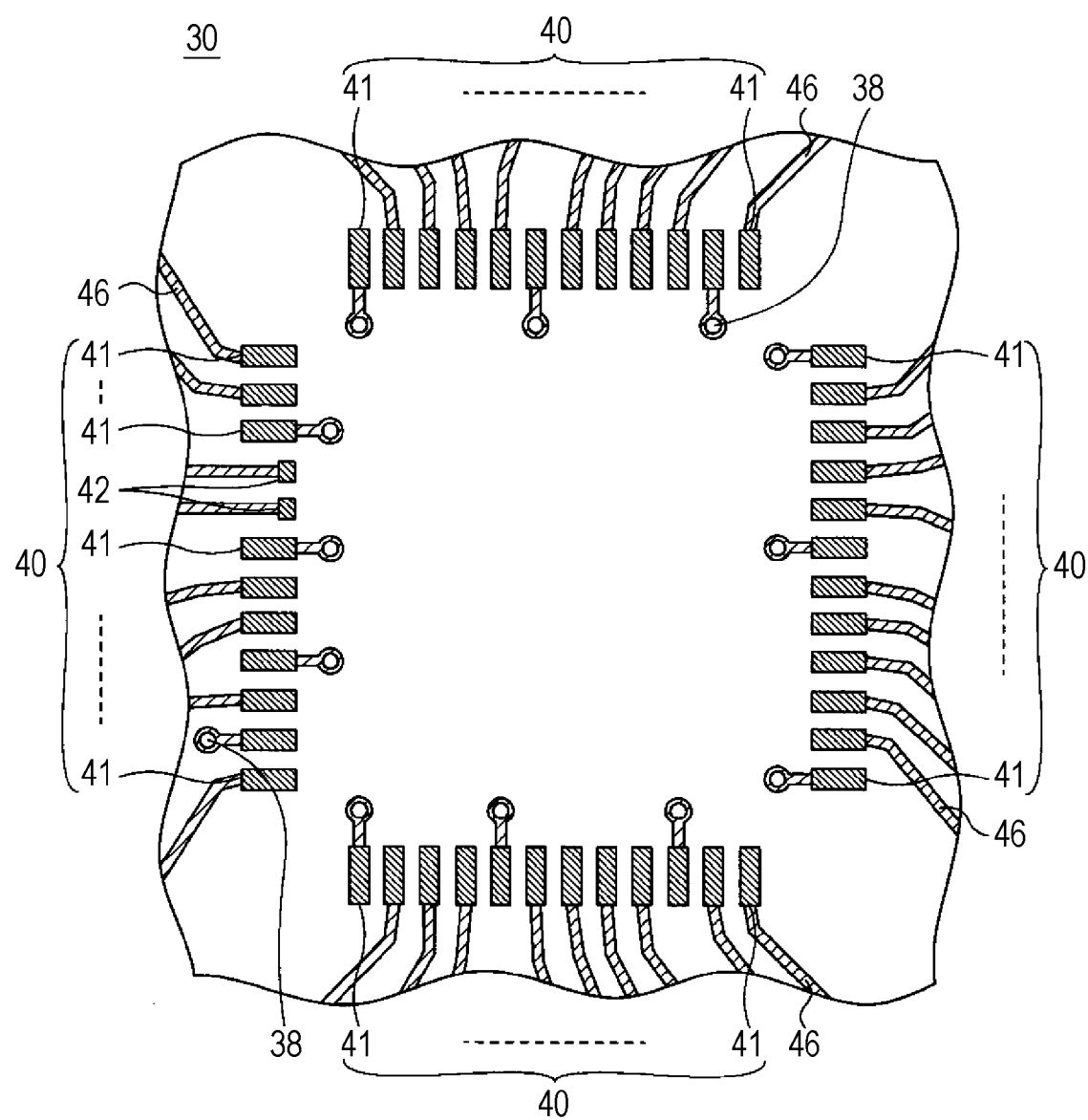
FIG. 2 is a top view for illustrating a wiring board of the first embodiment.
Figure 3:
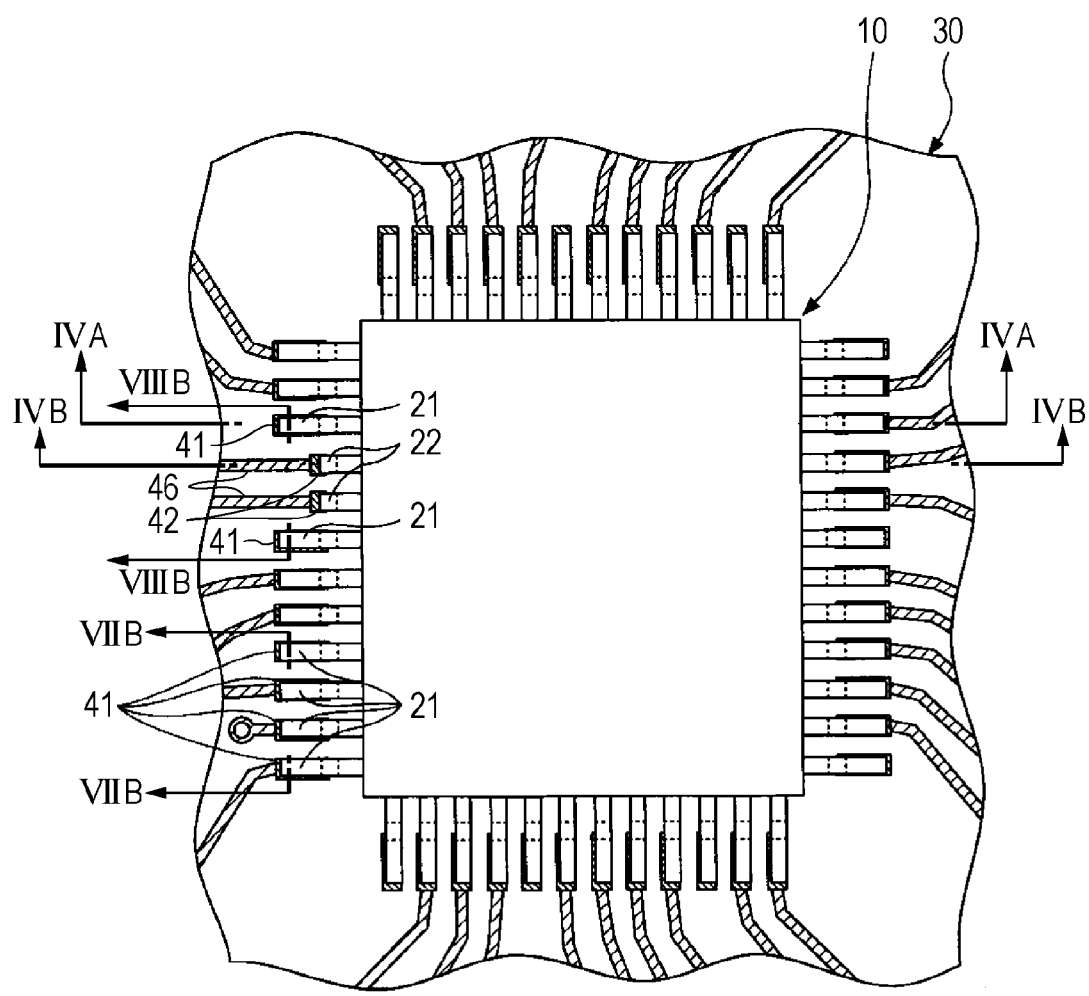
FIG. 3 is a top view for illustrating a semiconductor device mounted on a wiring board of the first embodiment.
Figure 5A:
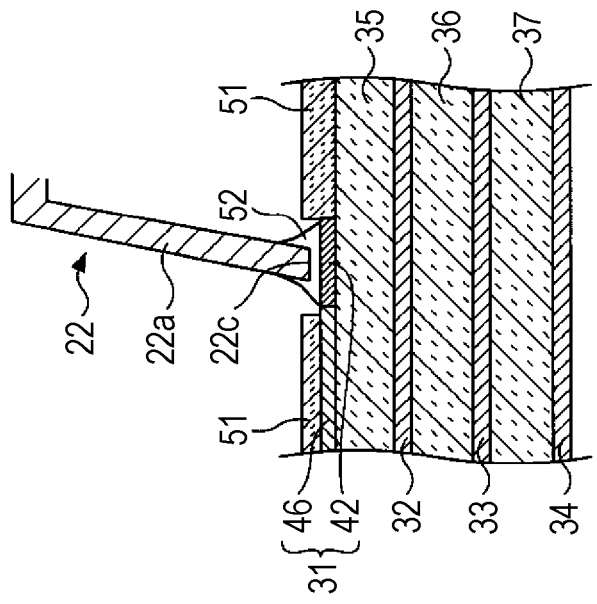
FIG. 5A illustrates enlargement of portions surrounded by dashed lines drawn in FIG. 4A.
Figure 5B:
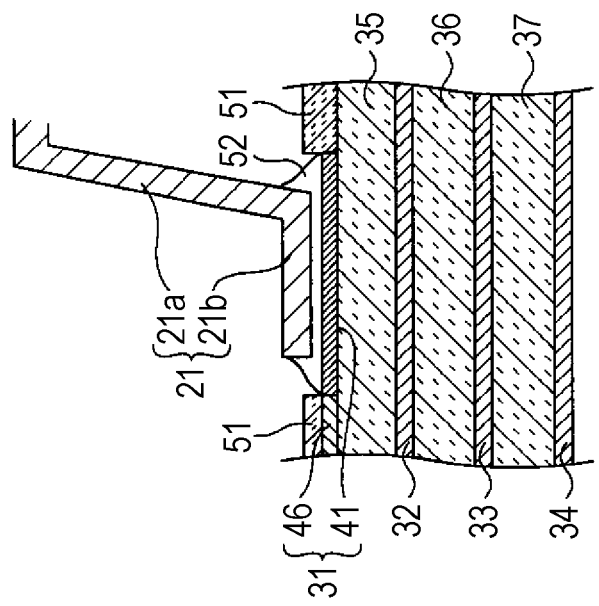
FIG. 5B illustrates enlargement of portions surrounded by dashed lines drawn in FIG. 4B.

The cross section on the upper side in FIG. 1 is a cross section along a straight line I-I drawn in the top view on the lower side in FIG. 1. FIG. 2 illustrates a top view of a wiring board 30. FIG. 3 illustrates a top view of the semiconductor device 10 being mounted on the wiring board 30. FIGS. 4A and 4B illustrate cross sections along straight lines IVA-IVA and IVB-IVB drawn in FIG. 3, respectively. Further, FIGS. 5A and 5B illustrate enlargements of portions surrounded by dashed lines drawn in FIGS. 4A and 4B, respectively.

In this case, the straight lines I-I in FIG. 1 and IVB-IVB in FIG. 3 are selected in such a way as to include a particular lead (a lead 22 described later) of the semiconductor device 10, and the straight line IVA-IVA is selected in such a way as to exclude the lead (to include only a lead 21 describe later).

Refer to FIG. 1. The semiconductor device 10 has a container 12 of a QFP package shape containing a semiconductor chip 11, and a plurality of leads 20. The container 12 is typically resin-sealed and integrally formed as illustrated in FIG. 1. The container 12 may be formed, however, by a plurality of members like having, e.g., a radiator plate exposed on a surface. Each of the plural leads 20 is electrically connected to a corresponding terminal of the semiconductor chip 11 by a corresponding wire 13 in an inner lead portion in the container 12.

The leads 20 include two leads 22 to be used for transmission of a particular signal and lots of other leads 21. The leads 21 and 22 are different from each other in shapes of outer lead portions sticking out from the container 12 as described later with reference to FIGS. 4 and 5. The two leads 22 are a pair of adjacent leads in particular to be used for transmission of a differential signal. The leads 21 are used for transmission of other signals and power and ground (GND) lines. Incidentally, the semiconductor device 10 may have a plurality of pairs of the leads 22 so as to handle a plurality of differential transmission signals, etc.

Figure 6:
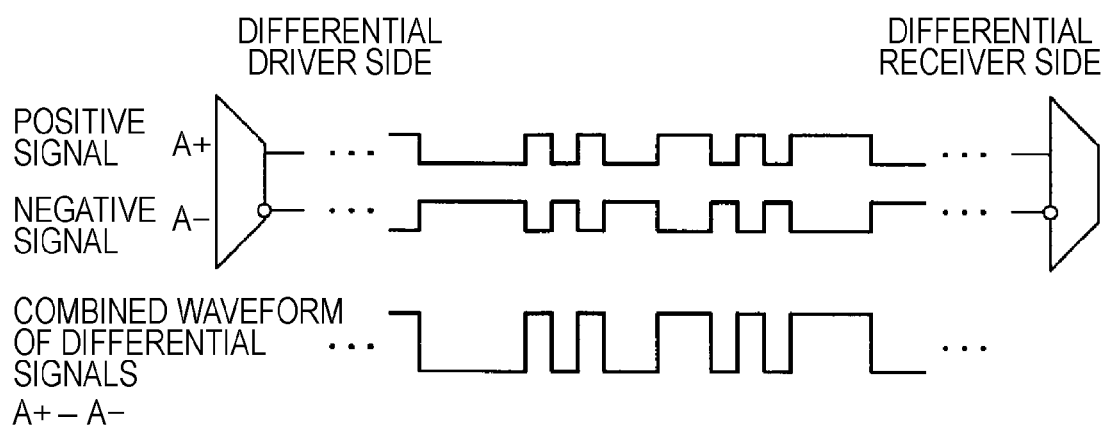
FIG. 6 is a conceptual diagram for illustrating differential transmission.

The differential transmission mentioned here is different from single-ended transmission for transmitting a signal on a single signal line. The differential transmission is a transmission system illustrated in a conceptual diagram in FIG. 6 for dividing one signal into two small amplitude signals in opposite phase (positive signal A+, negative signal A−) on a driver side, and for transmitting the small amplitude signals through two signal lines. A difference between the two transmitted signals A+ and A− is taken on a receiver side so that the two signals are combined. The differential transmission has an advantage in removal of common mode noise and enables a higher signal frequency. The differential transmission is used, e.g., by various high speed interface macros, such as LVDS (low voltage differential signaling) (0.5 Gbps-3.125 Gbps), PCI-Express (2.5 Gbps, 5 Gbps), Serial-ATA (1.5 Gbps, 3 Gbps, 6 Gbps), USB3.0 (5 Gbps), HDMI (1.65 Gbps, 3.4 Gbps) and FPD-link.

Refer to FIG. 2. The wiring board 30 is a board on which one or a plurality of semiconductor devices such as the semiconductor device 10 and other parts are mounted, and is, e.g., a motherboard of an electronic apparatus. The wiring board 30 has a plurality of mount pads 40 arranged to meet positions of tips (mount connection portions) of the leads 20 of the semiconductor device 10 for mounting the semiconductor device 10. The plural pads 40 include lots of pads 41 to be connected to the leads 21 and a pair of pads 42 to be connected to the paired leads 22 of the semiconductor device 10.

The pads 40 each lead to respective adjacent wires 46. Refer to FIG. 4 as well. The wiring board 30 may be a multiple-layered board having a plurality of conductive layers 31-34 on its front, middle layers and/or back. Although the plural conductive layers 31-34 are separated from each other by isolating layers 35-37, wiring patterns on the different conductive layers 31-34 may be connected to each other through via holes 38, etc, in accordance with a desired circuit configuration. The front of the wiring board 30 (on which the semiconductor devices are mounted) includes the conductive layer 31 provided with the pads 40 and the wires 46 described above. Further, the conductive layer 32, i.e., the second front layer of the wiring board 30 includes a power plane or a GND plane widely expanded and connected to the power line or the GND line.

Refer to FIGS. 3-5. In order to be loaded onto the wiring board 30, the semiconductor device 10 is mounted on the wiring board 30 in such a way that the mount connection portions of the leads 21 and 22 are arranged to meet the positions of the pads 41 and 42, respectively. The semiconductor device 10 is joined to the wiring board 30 typically by means of solder reflow. Thus, solder masks 51 are formed on the front of the wiring board 30 except for the portions of the pads 40 (41 and 42), so as to prevent solder 52 from causing a short circuit bridge.

The leads 21 and 22 are by and large different from each other in lengths of outer lead portions. In further detail, the lead 21 has an ordinary so-called gull-wing shape. That is, the lead 21 has a leg portion 21a and a foot portion 21b in the outer lead portion. The leg portion 21a sticks out from the container 12 of the semiconductor device 10 and is extended to a position close to the pad 41 of the wiring board 30. The foot portion 21b bends from the leg portion 21a and is joined to the surface of the pad 41 via the solder 52. Meanwhile, the outer lead portion of the lead 22 has only a leg portion 22a which corresponds to the leg portion 21a of the lead 21 as exemplarily illustrated, and an end face 22c of the leg portion 22a is joined to the pad 42 on the wiring board 30 via the solder 52. Thus, a joint face between the lead 22 and the pad 42 is rendered smaller than a joint face between the lead 21 and the pad 41.

Further, the difference in the size of the joint faces between the leads and the pads makes an area of the pad 42 smaller than an area of the pad 41.

Then, an effect of the embodiment will be explained with reference to FIGS. 7 and 8.

Figure 7A:
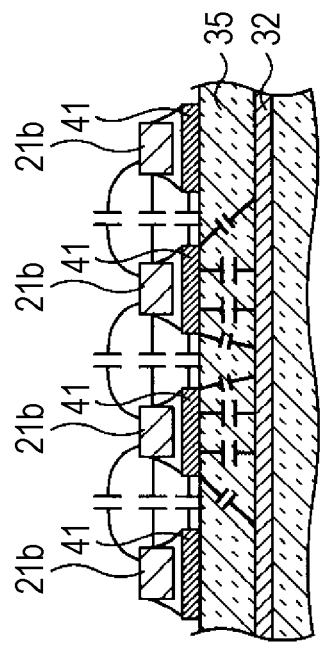
FIG. 7A is a cross section for illustrating parasitic capacitance caused in connections between leads and pads.
Figure 7B:
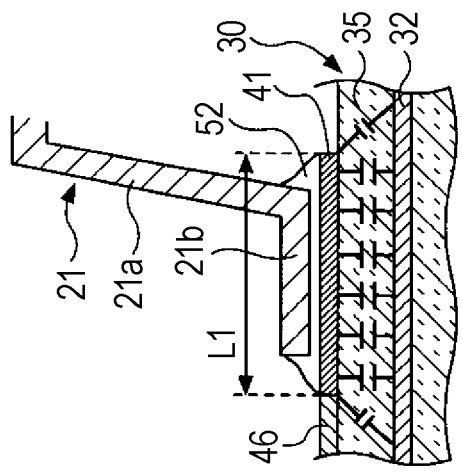
FIG. 7B is a cross section for illustrating parasitic capacitance caused in connections between leads and pads.

FIGS. 7A and 7B illustrate a portion around the joint between the lead 21 and the pad 41. FIG. 7A illustrates a same cross section as that illustrated in FIG. 5A, i.e., along the IVA-IVA line drawn in FIG. 3. FIG. 7B illustrates a cross section being perpendicular to FIG. 7A, i.e., along a VIIB-VIIB line drawn in FIG. 3.

FIGS. 8A and 8B similarly illustrate a portion around the joint between the lead 22 and the pad 42. FIG. 8A illustrates a same cross section as that illustrated in FIG. 5B, i.e., along the IVB-IVB line drawn in FIG. 3. FIG. 8B illustrates a cross section being perpendicular to FIG. 8A, i.e., along a VIIIB-VIIIB line drawn in FIG. 3.

In this case, the straight line VIIB-VIIB drawn in FIG. 3 is selected in such a way as to include four of the leads 21 (more exactly, the foot portions 21b) and four of the pads 41. Further, the straight line VIIIB-VIIIB drawn in FIG. 3 is selected in such a way as to include two of the leads 21 (more exactly, the foot portions 21b), two of the pads 41, and two of the wires 46 located in between which lead to the two pads 42.

The lead 21 has the leg portion 21a and the foot portion 21b similarly to an ordinary gull-wing lead. The pad 41 has a length L1 for accommodating the foot portion 21b. Thus, as illustrated in FIG. 7A, a relatively large amount of capacitance exists in a portion in case of the pad 41 faces the conductive layer (power or GND plane) 32 located below the pad 41. Further, as illustrated in FIG. 7B, relatively large amounts of capacitance exist between adjacent ones of the foot portions 21b and between adjacent ones of the pads 41.

Meanwhile, the lead 22 has no foot portion and has only the leg portion 22a. The pad 42 has a length L2 enough to accommodate the end face 22c of the leg portion 22a and shorter than the length L1 of the pad 41. Thus, as illustrated in FIG. 8A, an amount of capacitance existing in a portion in case of the pad 42 faces the conductive layer 32 located below the pad 42 is reduced as compared with the case of the pad 41 illustrated in FIG. 7A.

Further, as illustrated in FIG. 8B, the lead 22 is prevented from being parallel to the foot portion 21b of the adjacent lead 21, and a portion in case of the pad 41 is parallel to the pad 42 is reduced. Thus, amounts of capacitance between the individual leads 22 and the adjacent leads and amounts of capacitance between the individual pads 42 and the adjacent pads are reduced as compared with the case illustrated in FIG. 7B in case of the plural leads 21 are adjacent to the plural pads 41.

The high speed interface macros exemplarily listed earlier, e.g., require a specific value such as 90 or 100 ohms for transmission line differential impedance. Use of the leads 21 and the pads 41 causes the differential impedance to be reduced owing to their parasitic capacitance, and causes signal reflection. Use of the leads 22 accompanied by use of the pads 42 having smaller areas than the pads 41 enables reduction of the parasitic capacitance, and thereby enables the transmission line differential impedance to be close to the specific value. Thus, according to the embodiment, the signal reflection on the differential transmission lines may be reduced and transmission quality of the high speed differential signal may be enhanced.

Incidentally, it is assumed for the above explanation that the lead 22 has no foot portion 21b that the lead 21 has. The shape of the lead 22 is not limited to that, and a lead 22 having a shortened foot portion may enjoy the capacitance reduction effect described above as well.

Further, according to the embodiment, particular ones of the leads 20 of the semiconductor device 10 to be used for the differential signal transmission are specified as the leads 22. Thus, strength of the joint between the semiconductor device 10 and the wiring board 30 is not significantly reduced, so that mount reliability may be secured.

Incidentally, e.g., leads of different lengths may be formed in advance in lead frame design, or a mold shape to be used for separating leads may be changed, so that the leads 20 including the leads 21 and 22 of different lengths and shapes may be easily formed.

Figure 9A:
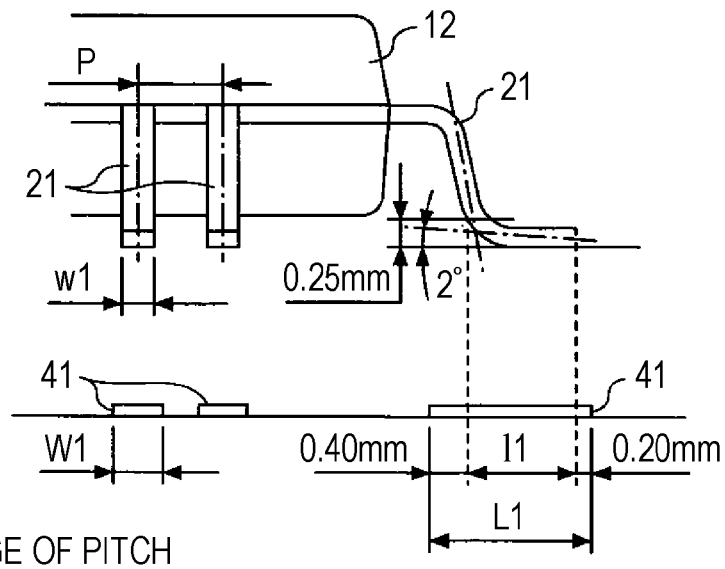
FIG. 9A illustrates design examples of the first embodiment.
Figure 9B:
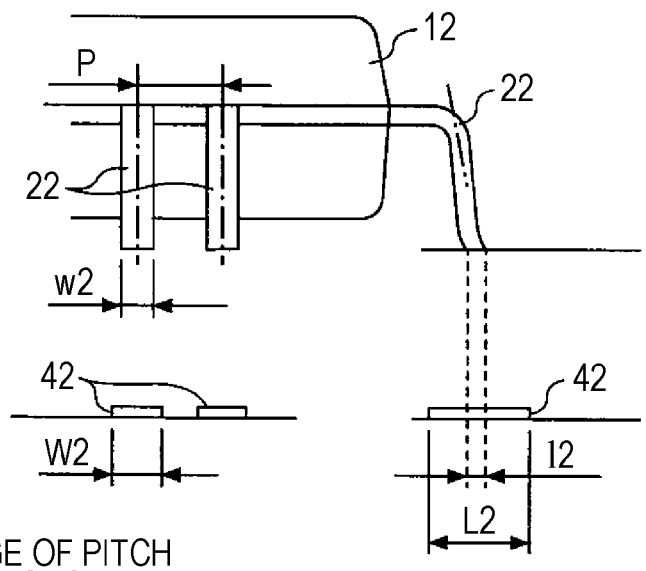
FIG. 9B illustrates design examples of the first embodiment.

Then, a design example of the first embodiment will be explained with reference to FIG. 9. FIG. 9A illustrates a design example of the lead 21 and the pad 41. FIG. 9B illustrates a design example of the lead 22 and the pad 42.

A width W1 (in mm) and a length L1 (in mm) of the pad 41 may be selected, e.g., to meet a following relationship.

$$w1+0.03 \leq W1 \leq P \times 0.6 \tag{1}$$

$$L1 \geq l1+0.60 \tag{2}$$

On condition that P is a pitch of the leads 20 (21, 22) (that equals a pitch of the pads 40 (41, 42)), w1 is a width of the lead 21, and l1 is a length of the mount connection portion (foot portion 21b). All those variables are in millimeters (mm).

Incidentally, according to the application, the width and the length of a pad represent dimensions in directions perpendicular and parallel to the direction in which the lead joined to the pad is extended, respectively, in the top view such as FIG. 3. Further, a direction of the width of the lead corresponds to a direction of the width of the pad that the lead is joined to.

Thus, e.g., let P=0.5 mm, w1=0.22 mm and l1=0.5 mm. Then, W1 and L1 may be selected, e.g., to be 0.3 mm and 1.1 mm, respectively. In this case, the pad 41 being rectangular has an area of 0.33 mm2. Incidentally, the pad 41 is not limited to rectangular in its shape, and may be circular, elliptical or polygonal.

The area of the pad 41 is different from the above value depending upon its shape.

Meanwhile, a width W2 (in mm) and a length L2 (in mm) of the pad 42 may be selected, e.g., to meet a following relationship.

$$w2+0.03 \leq W2 \leq P \times 0.6 \tag{3}$$

$$l2 \leq L2 < l2+0.60 \tag{4}$$

On condition that w2 is a width of the lead 22, and l2 is a length of the mount connection portion (the lead end face 22c). All those variables are in mm.

Thus, e.g., let P=0.5 mm, w2=0.22 mm and l2=0.15 mm. Then, W2 and L2 may be selected, e.g., to be 0.3 mm and 0.21 mm, respectively. In this case, the pad 42 being rectangular has an area of 0.063 mm2, which is about 19 percent of the area of the pad 41 described above. Incidentally, the pad 42 is not limited to rectangular in its shape either, and may be circular, elliptical or polygonal. The area of the pad 42 is different from the above value depending upon its shape.

Figure 10:
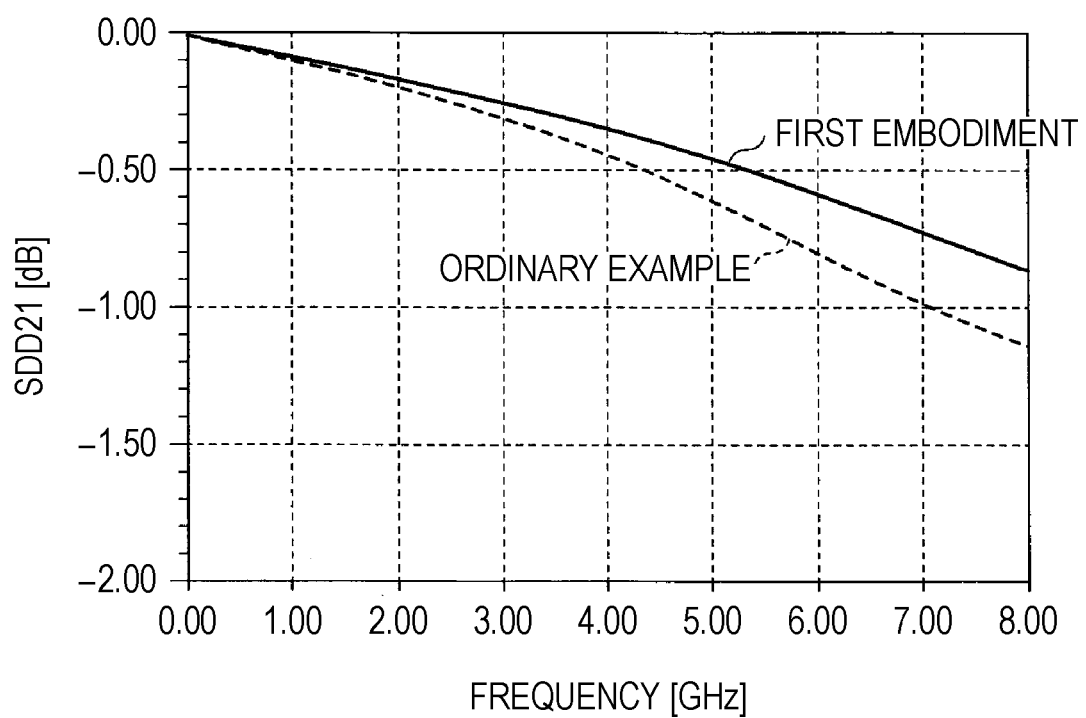
FIG. 10 exemplarily illustrates results of a simulation of a transmission characteristic of a differential transmission line.

A transmission characteristic (SSD21 characteristic) of the differential signal transmission line is simulated in the condition that the leads 21 and 22 and the pads 41 and 42 of the exemplary dimensions given above are used, and FIG. 10 illustrates results of the simulation. One of the results is of the embodiment applied to the simulation in case that the leads 22 and the pads 42 are used only for the differential transmission line, and is indicated as "first embodiment". The other one of the results is of a case in case that the leads 21 and the pads 41 are used for all the transmission lines including the differential signal transmission line, and is indicated as "ordinary example". As SDD21 curves represent better characteristics as being closer to 0 dB, the "first embodiment" is apparently better than the "ordinary example" in the high frequency characteristic.

Second Embodiment

Figure 11:
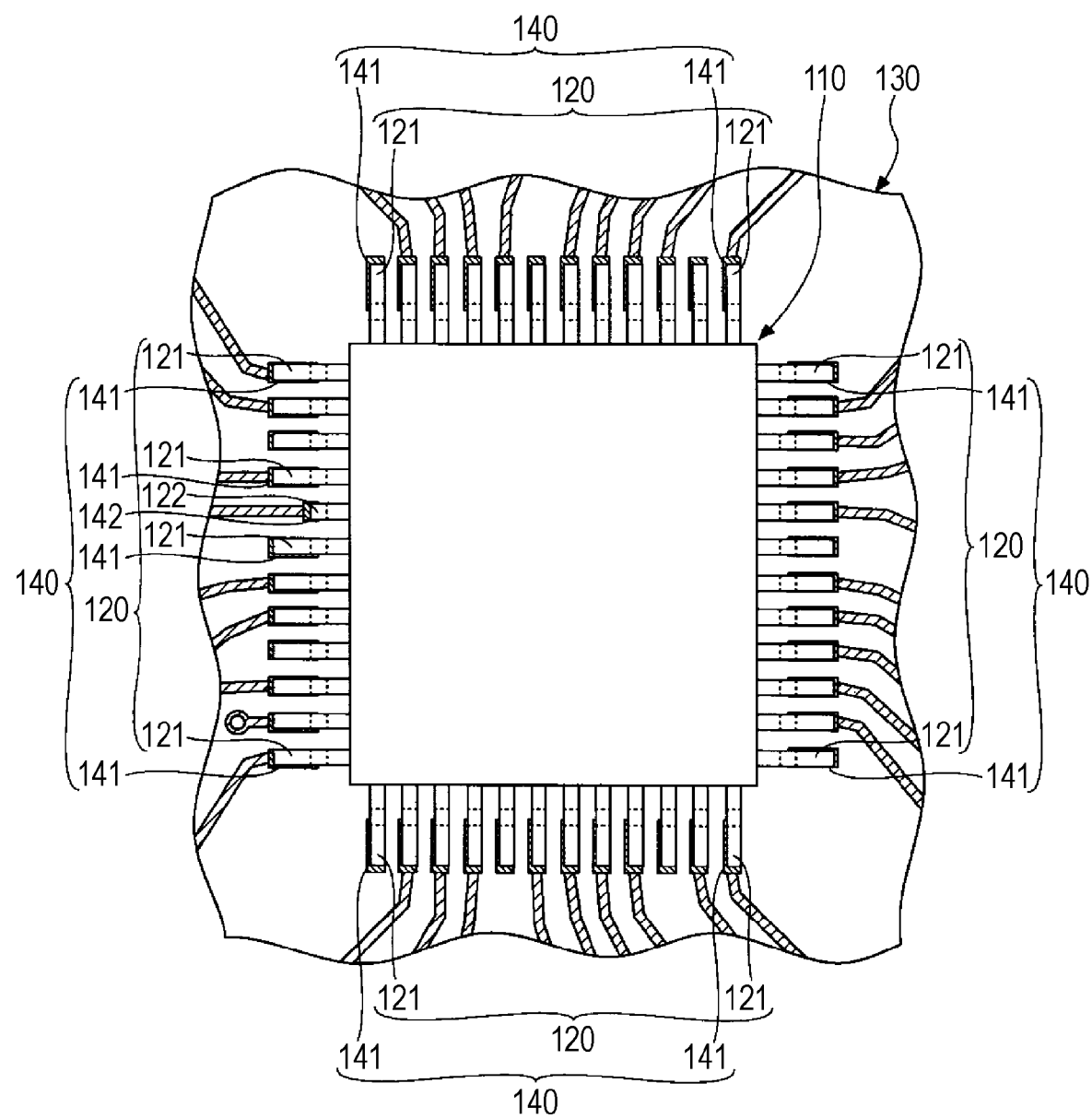
FIG. 11 is a top view for illustrating a semiconductor device and mounted on a wiring board of a second embodiment.
Figure 12:
FIG. 12 is a conceptual diagram for illustrating a clock signal.

Then, a semiconductor device 110 of a second embodiment and a circuit board will be explained with reference to FIG. 11. FIG. 11 illustrates a top view of the semiconductor device 110 being mounted on a wiring board 130. The semiconductor device 110 and the wiring board 130 have portions similar to those of the semiconductor device 10 and the wiring board 30 explained as to the first embodiment. Thus, corresponding portions are given similar reference numerals, and an explanation of a common matter is omitted.

The semiconductor device 110 has a plurality of surface mount leads 120 which includes one lead 122 to be used for transmitting a particular signal and lots of other leads 121. The leads 121 and 122 have structures similar to those of the leads 21 and 22 explained as to the first embodiment, respectively.

The wiring board 130 is a board on which one or a plurality of semiconductor devices such as the semiconductor device 110 and other parts are mounted. The wiring board 130 has lots of mount pads 140 arranged to meet positions of mount connection portions of the leads 120 of the semiconductor device 110. The pads 140 include lots of pads 141 to be connected to the leads 121 of the semiconductor device 110 and one pad 142 to be connected to the lead 122. The pads 141 and 142 have structures similar to those of the pads 41 and 42 explained as to the first embodiment, respectively. The pads 141 and 142 have dimensions corresponding to lengths of the mount connection portions of the leads 121 and 122, respectively.

The lead 122 is used for single-ended transmission that requires high speed signal transmission in particular. The leads 121 are used for transmission of other signals and power and GND lines. A single-ended high speed signal is, e.g., a clock signal. The clock signal has a signal waveform formed by low and high levels alternating with each other at a constant high frequency (short interval).

Incidentally, the semiconductor device 110 may have a plurality of leads 122 so as, e.g., to handle a plurality of clock signals.

An amount of capacitance between the lead 122 and an adjacent one of the leads 121 is reduced as compared with the leads 121, similarly as explained with reference to FIGS. 7 and 8. Further, amounts of capacitance between the pad 142 and an adjacent one of the pads 141 and between the pad 142 and the power or GND plane in the wiring board 130 located below the pad 142 are reduced as compared with the pads 141.

A transmission line of a clock signal requires impedance of 50 ohms in general. Use of the lead 122 accompanied by area reduction of the pad 142 enables the amount of capacitance to be reduced, and further enables the transmission line impedance to be close to 50 ohms. Signal reflection on the clock signal transmission line may thereby be reduced, and transmission quality of the high speed clock signal may be enhanced.

Further, according to the embodiment, particular one of the leads 120 of the semiconductor device 110 to be used for the high speed single-ended transmission is specified as the lead 122. Thus, strength of the joint between the semiconductor device 110 and the wiring board 130 is not significantly reduced, so that mount reliability may be secured.

(Modifications)

Figure 13A:
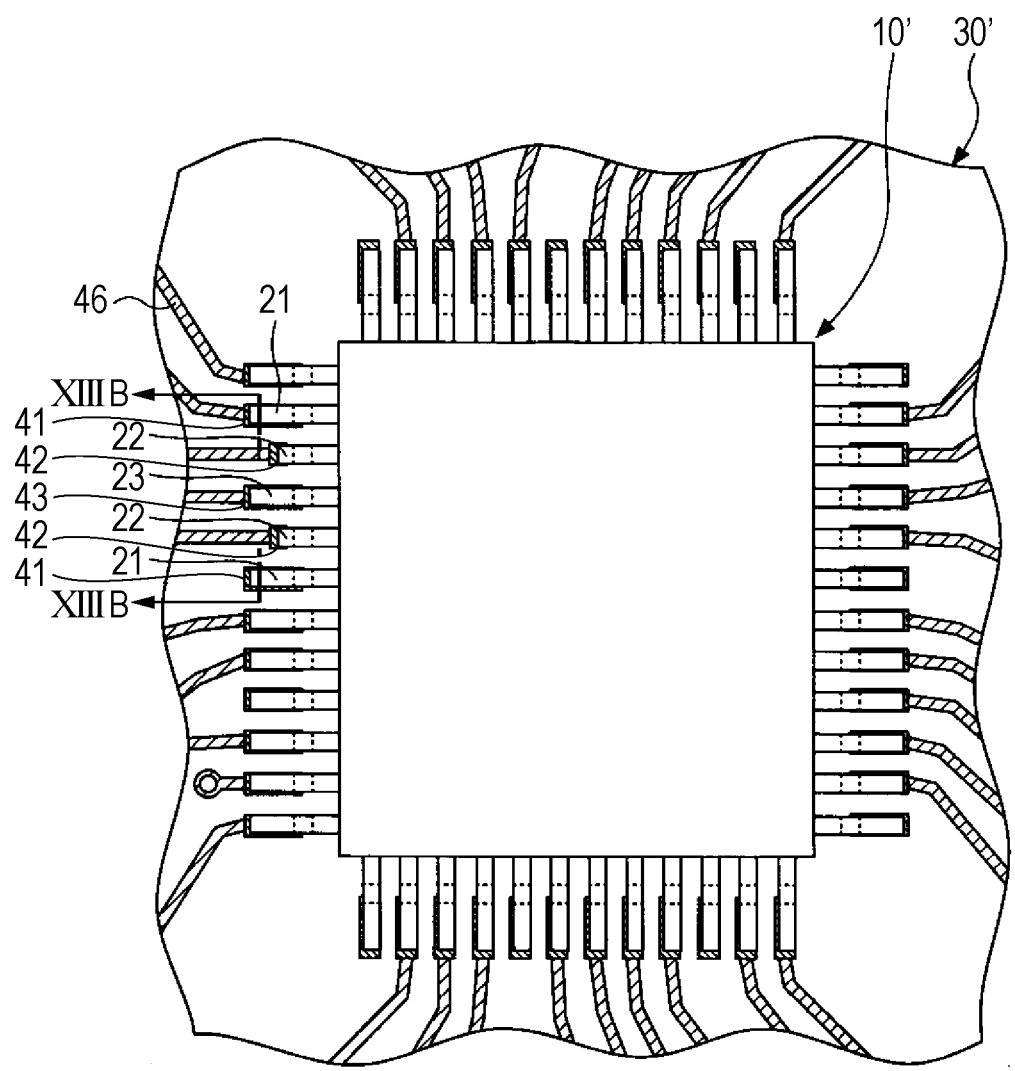
FIG. 13A is a top view for illustrating a semiconductor device mounted on a wiring board of a first modification.
Figure 13B:
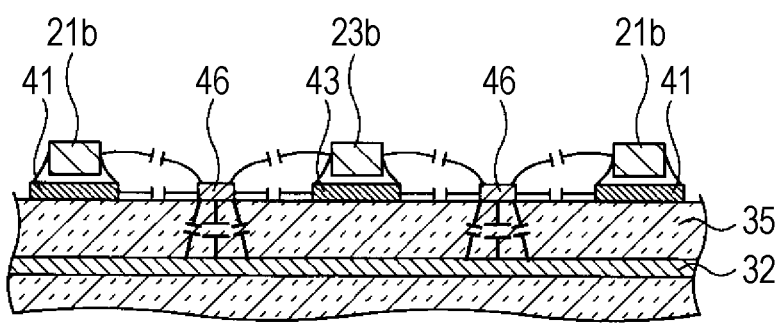
FIG. 13B is a cross section for illustrating a semiconductor device mounted on a wiring board of a first modification.

Then modifications of the first and second embodiments will be explained. To start with, a semiconductor device 10' of a modification of the first embodiment and a circuit board will be explained with reference to FIG. 13. FIG. 13A illustrates a top view of the semiconductor device 10' being mounted on a wiring board 30'. FIG. 13B illustrates a cross section along a straight line XIIIB-XIIIB drawn in FIG. 13A. In this case, the straight line XIIIB-XIIIB is selected in such a way as to include two of the leads 21 (more exactly, the foot portions 21b), two of the pads 41, two of the wires 46 located in between which lead to the two pads 42, and one lead and one pad (a lead 23 and a pad 43 described later) located between the two wires 46.

The semiconductor device 10' is different from the semiconductor device 10 in having one lead 23 between the paired leads 22 which transmit a differential signal. The lead 23 has a same shape as that of the lead 21. The pad 43 put on the wiring board 30' that the lead 23 is connected to has a same shape and same dimensions as those of the pad 41. The lead 23 is a power or GND lead.

As described above, a separation between the paired leads 22 which transmit the differential signal A+, A− increases and the power or GND lead 23 is located in between, so that a capacitive coupling between the two leads 22 is reduced. Common mode impedance of the differential transmission line may be reduced owing to the above decoupling effect. Thus, according to the modification illustrated in FIG. 13, both improvement in the differential impedance of the differential transmission line and reduction in the common mode impedance may be accomplished.

Incidentally, e.g., one power or GND lead 23 is arranged between the paired leads 22 in FIG. 13. A pair of the power and GND leads 23 may be arranged there.

Figure 14:
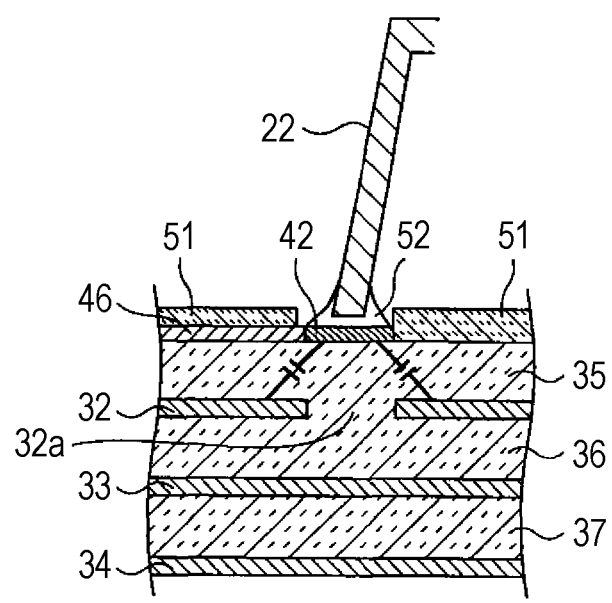
FIG. 14 is a cross section for illustrating a semiconductor device mounted on a wiring board of a second modification.

Then, a second modification of the first embodiment will be explained with reference to FIG. 14. Incidentally, the modification of the first embodiment explained here may be equally applied to the second embodiment. FIG. 14 is a cross section similar to FIG. 5B illustrating an enlargement of a portion around the joint between the lead 22 and the pad 42.

The conductive layer (power or GND plane) 32 of the wiring board 30 of the modification has an aperture 32a at a portion opposite the pad 42. FIG. 14 apparently illustrates that the amount of capacitance between the pad 42 and the conductive layer 32 is reduced further than that illustrated in FIG. 8A.

Figure 15:
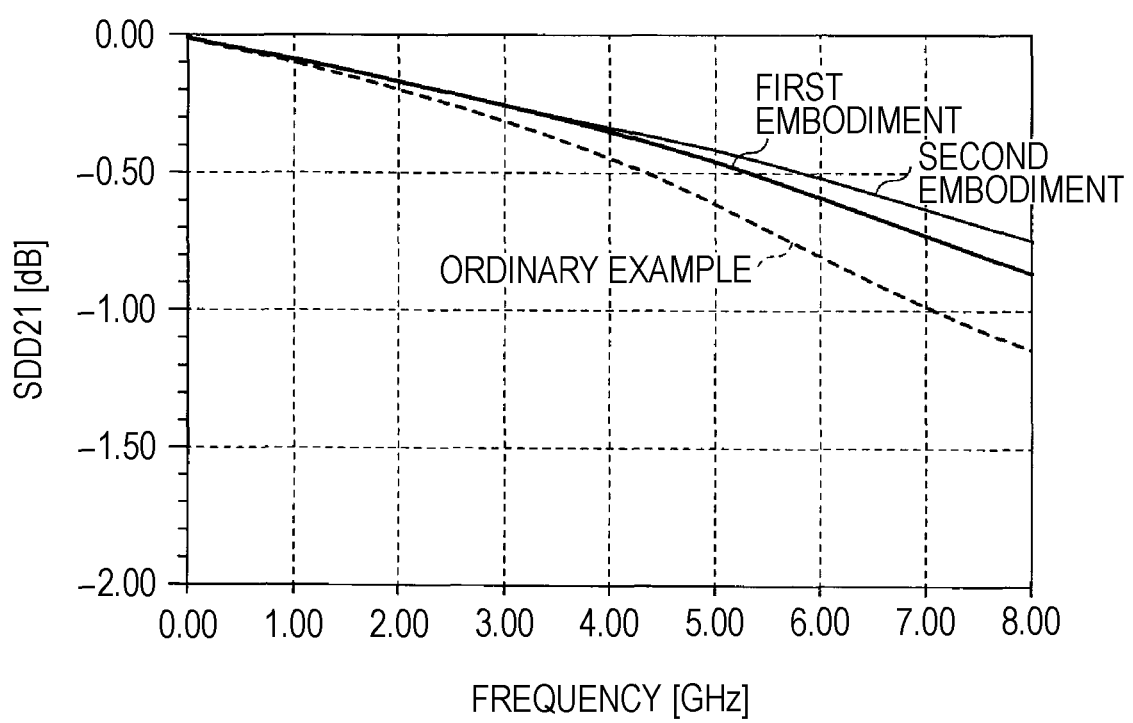
FIG. 15 exemplarily illustrates results of a simulation of a transmission characteristic of a differential transmission line.

A transmission characteristic (SSD21 characteristic) of the differential signal transmission line is simulated in the condition that the conductive layer 32 is provided with the aperture 32a, and FIG. 15 illustrates a result of the simulation as "second embodiment". The other conditions for the simulation such as structural parameters of the leads 21 and 22, the pads 41 and 42, etc. are same as the conditions used for the simulation illustrated in FIG. 10. FIG. 15 illustrates the results of "first embodiment" and "ordinary example" illustrated in FIG. 10 as well for comparison. Apparently the "second embodiment" is still better than the "first embodiment" in the high frequency characteristic.

Incidentally, for the simulation related to FIGS. 14 and 15, the aperture 32a of the conductive layer 32 is same as the pad 42 in the shape and dimensions. As long as being opposite the pad 42, though, the aperture 32a may have other shapes and dimensions. The aperture 32a may be enlarged, e.g., to a side in case of the wire 46 is not arranged, so that a capacitance reduction effect may be enhanced without a change of impedance of the wire 46 that leads to the pad 42.

Further, the width of the aperture 32a may be same as the width W2 of the pad 42 (see FIG. 9B) or the pitch P of the leads and the pads in a direction perpendicular to the cross section illustrated in FIG. 15. The width of the aperture 32a in this direction, however, may preferably be equal to or shorter than the above pitch P in order that impedance of an adjacent pad, etc. is less affected.

Then, a third modification of the first embodiment will be explained with reference to FIG. 16. Incidentally, the modification of the first embodiment explained here may be equally applied to the second embodiment.

Figure 16:
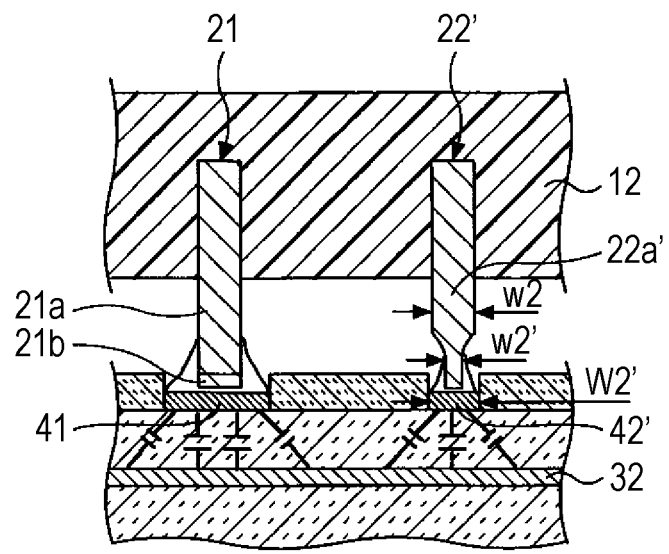
FIG. 16 is a drawing for illustrating a semiconductor device mounted on a wiring board of a third modification.

FIG. 16 illustrates two adjacent leads 21 and 22'. The lead 22' is same as the lead 22 described above in having no foot portion, and is different from the lead 22 in that a leg portion 22a' is tapered at its tip. The width of the leg portion 22a' of the lead 22' is narrowed down from w2 to w2' around the mount joint portion owing to an illustrated taper or a step. In this case, the width W2' of the pad 42' of the wiring board 30 joined to the lead 22' may be narrowed down, so that the area of the pad 42' may be made further smaller than that of the pad 42 described above.

If, e.g., let w2'=0.12 mm for the example described above in case of P=0.5 mm, w2=0.22 mm, l2=0.15 mm, the width w2 of the pad 42=0.3 mm and the length L2=0.21 mm, the value of W2' may be made W2'=0.2 mm while the equation (3) is satisfied. In this case, the area of the rectangular pad 42' is 0.042 mm2 which is about 13 percent of the area 0.33 mm2 of the pad 41 described above.

Thus, the amounts of capacitance of the lead 22' and the pad 42' may further be reduced and the high speed transmission characteristic may further be improved owing to the narrower lead tips and pads.

Incidentally, it is assumed for the above explanation that the lead 22' has no foot portion. The shape of the lead 22' is not limited to that, and the lead 22' having a narrowed down foot portion may enjoy the capacitance reduction effect described above.

Then, a fourth modification of the first embodiment will be explained with reference to FIG. 17. Incidentally, the modification of the first embodiment explained here may be equally applied to the second embodiment.

Figure 17:
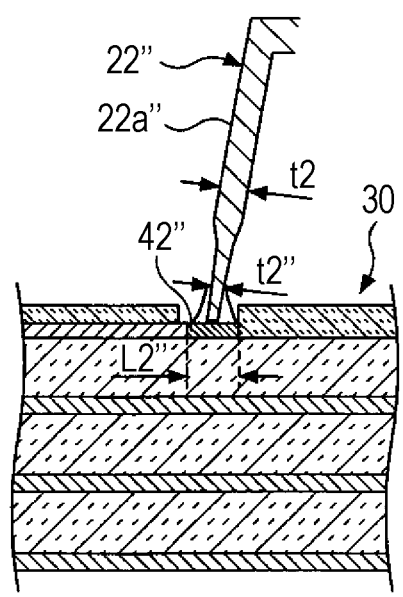
FIG. 17 is a cross section for illustrating a semiconductor device mounted on a wiring board of a fourth modification.

FIG. 17 illustrates one lead 22" in a cross section similar to FIG. 5B. The lead 22" is same as the lead 22 described above in having no foot portion, and is different from the lead 22 in that a leg portion 22a" is made thin at its tip. The thickness of the leg portion 22a" of the lead 22' is made thinner from t2 to t2" around the mount joint portion owing to an illustrated taper or a step. In this case, the length L2" of the pad 42" of the wiring board 30 joined to the lead 22" may be shortened, so that the area of the pad 42" may be made further smaller than that of the pad 42 described above.

Thus, the amounts of capacitance of the lead 22" and the pad 42" may further be reduced and the high speed transmission characteristic may further be improved owing to the thinner lead tips and shorter pads.

Further, the fourth modification may be applied in combination with the third modification explained with reference to FIG. 16. If, e.g., let the thickness t2" and the width w2" be around 0.07 mm together at the tip portion of the lead 22", then the length L2" and the width W2" of the pad 42" may be made 0.15 mm together. In this case, the area of the pad 42" is 0.0225 mm2 which is about 7 percent of the area 0.33 mm2 of the pad 41 described above.

Incidentally, a lead having a local thin portion such as the lead 22" may be made, e.g., by means of a local half-etching process applied when patterns of lead frames are formed.

The embodiments have been described above in detail. The invention is not limited to a particular embodiment, and may be variously modified and changed within the scope of the invention described as claims. The first and second embodiments, e.g., may be applied in combination with each other. Further, the first to fourth modifications may be applied in combination with one another. Further, although having been explained as being applied to the semiconductor device having the QFP package form, the embodiment described above may be applied to a semiconductor device of other package forms having a plurality of surface mount leads such as an SOP type. Further, although having been explained as being applied to the gull-wing leads, the embodiment described above may be applied to a semiconductor device having another type of leads such as a J-lead type.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor device for mounting on a wiring board, comprising:
a container for containing a semiconductor chip; and
a plurality of leads each including a mount connection portion at one end to connect the semiconductor device to the wiring board,
wherein
the plurality of leads include first leads and second leads,
a signal transmission rate of the first leads is higher than that of the second leads, and
the mount connection portion of the first lead is smaller than that of the second lead,
wherein the second leads are located on a directly opposite side of the container from the first leads;
a portion of the first lead extending from the container to an end of the first lead is different in length from a portion of the second lead extending from the container to an end of the second lead.

2. The semiconductor device according to claim 1, wherein the first leads include a pair of leads for transmission of a differential signal.

3. The semiconductor device according to claim 1, wherein the first leads include a lead for single ended transmission of a clock signal.

4. The semiconductor device according to claim 1, wherein the first lead includes a first leg portion sticking out from the container, an end of the first leg portion including the mount connection portion, and
the second lead includes a second leg portion sticking out from the container and a foot portion joined to the second leg portion, the foot portion including the mount connection portion.

5. The semiconductor device according to claim 2, wherein one of the second leads is connected to a power line or a ground line and is allocated between the pair of the first leads.

6. The semiconductor device according to claim 4, wherein a width of the end of the first leg portion is narrower than a width of a center of the first leg portion.

7. The semiconductor device according to claim 4, wherein a thickness of the end of the first leg portion is made thinner than a thickness of a center of the first leg portion.

8. A circuit board comprising:
a semiconductor device including:
a container for containing a semiconductor chip,
first leads sticking out from the container, each of the first leads
having a first mount connection portion at one end, and
second leads sticking out from the container, each of the second leads having a second mount connection portion at one end; and
a wiring board for mounting the semiconductor device, including:
first pads each connected to corresponding one of the first leads, and
second pads each connected to corresponding one of the second leads,
wherein
the first mount connection portion is smaller than the second mount connection portion, and
an area of the first pad is smaller than an area of the second pad,
wherein the second leads are located on a directly opposite side of the container from the first leads;

a portion of the first lead extending from the container to an end of the first lead is different in length from a portion of the second lead extending from the container to an end of the second lead.

9. The circuit board according to claim 8, wherein the first lead includes a first leg portion sticking out from the container and an end of the first leg portion includes the first mount connection portion, and the second lead includes a second leg portion sticking out from the container and a foot portion joined to the second leg portion, the foot portion includes the second mount connection portion, and a length of the first pad is shorter than a length of the second pad.

10. The circuit board according to claim 8, wherein the wiring board includes a power layer or a ground layer, and the power or the ground layer has an aperture at a portion opposite the first pad.

11. The circuit board according to claim 8, wherein the first leads include a pair of leads for transmission of a differential signal, and one of the second leads is connected to a power line or a ground line and is allocated between the pair of the first leads.

12. The circuit board according to claim 9, wherein a width of the end of the first leg portion is narrower than a width of the foot portion of the second lead, and a width of the first pad is narrower than a width of the second pad.

13. The circuit board according to claim 9, wherein a thickness of the end of the first leg portion is made thinner than a thickness of a center of the first leg portion.

\* \* \* \* \*